(12) United States Patent
Minoura et al.

(10) Patent No.: US 9,496,380 B2
(45) Date of Patent: Nov. 15, 2016

(54) COMPOUND SEMICONDUCTOR DEVICE COMPRISING COMPOUND SEMICONDUCTOR LAYERED STRUCTURE HAVING BUFFER LAYER AND METHOD OF MANUFACTURING THE SAME

(75) Inventors: Yuichi Minoura, Kawasaki (JP); Toshihide Kikkawa, Kawasaki (JP); Toshihiro Ohki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1187 days.

(21) Appl. No.: 13/328,244

(22) Filed: Dec. 16, 2011

(65) Prior Publication Data
US 2012/0217543 A1    Aug. 30, 2012

(30) Foreign Application Priority Data
Feb. 25, 2011 (JP) .................... 2011-040673

(51) Int. Cl.
| | | |
|---|---|---|
| *H01L 29/778* | (2006.01) | |
| *H01L 21/265* | (2006.01) | |
| *H01L 29/06* | (2006.01) | |
| *H01L 29/10* | (2006.01) | |
| *H01L 29/66* | (2006.01) | |
| *H01L 29/20* | (2006.01) | |
| *H01L 29/423* | (2006.01) | |
| *H01L 29/45* | (2006.01) | |

(52) U.S. Cl.
CPC ....... *H01L 29/7787* (2013.01); *H01L 21/2654* (2013.01); *H01L 29/0603* (2013.01); *H01L 29/1075* (2013.01); *H01L 29/66462* (2013.01); H01L 29/2003 (2013.01); H01L 29/42356 (2013.01); H01L 29/42376 (2013.01); H01L 29/452 (2013.01)

(58) Field of Classification Search
CPC .............. H01L 29/66462; H01L 29/66431; H01L 29/778; H01L 29/7787; H01L 21/2654; H01L 29/0603; H01L 29/1075
USPC ......... 257/190, E29.024, E21.135, 194, 201, 257/76
See application file for complete search history.

(56) References Cited

U.S. PATENT DOCUMENTS

| | | | |
|---|---|---|---|
| 2002/0171405 A1* | 11/2002 | Watanabe | ..................... 323/282 |
| 2008/0067523 A1* | 3/2008 | Dwilinski et al. | .............. 257/76 |
| 2008/0303064 A1* | 12/2008 | Sato | .................... H01L 29/1029 257/194 |
| 2010/0019277 A1* | 1/2010 | Hata | .................... H01L 29/7783 257/190 |

(Continued)

FOREIGN PATENT DOCUMENTS

| | | |
|---|---|---|
| CN | 101752389 A | 6/2010 |
| JP | 6-151473 | 5/1994 |

(Continued)

OTHER PUBLICATIONS

Chinese Office Action dated Feb. 24, 2014 for corresponding Chinese Patent Application 201110451784.6, with English Translation, 21 pages.

(Continued)

*Primary Examiner* — Mohammad Islam
*Assistant Examiner* — Christina Sylvia
(74) *Attorney, Agent, or Firm* — Fujitsu Patent Center

(57) ABSTRACT

At least one kind of impurity selected from, for example, Fe, C, B, Ti, Cr is introduced into at least a buffer layer of a compound semiconductor layered structure from a rear surface of the compound semiconductor layered structure to make a resistance value of the buffer layer high.

15 Claims, 10 Drawing Sheets

(56) References Cited

U.S. PATENT DOCUMENTS

| | | | |
|---|---|---|---|
| 2010/0032717 A1 | 2/2010 | Palacios et al. | |
| 2010/0117118 A1* | 5/2010 | Dabiran et al. | 257/190 |
| 2010/0244041 A1 | 9/2010 | Oishi et al. | |
| 2010/0320505 A1* | 12/2010 | Okamoto et al. | 257/192 |
| 2011/0068370 A1* | 3/2011 | Kim | H01L 29/207 257/194 |
| 2011/0193096 A1* | 8/2011 | Imada | 257/76 |

FOREIGN PATENT DOCUMENTS

| | | | |
|---|---|---|---|
| JP | 09270522 A | * | 10/1997 |
| JP | 2007-251144 A | | 9/2007 |
| JP | 2010-238752 | | 10/2010 |
| TW | 200516773 | | 5/2005 |
| TW | 200845144 | | 11/2008 |

OTHER PUBLICATIONS

TWOA—Office Action of Taiwanese Patent Application No. 100147080 dated Oct. 14, 2014, with full English translation of the Office Action.

JPOA—Office Action of Japanese Patent Application No. 2011-040673 dated Dec. 16, 2014, with English Translation of the relevant part, p. 1, lines 25-28, of the Office Action.

JPOA—Office Action of Japanese Patent Application No. 2011-040673 dated May 19, 2015, with English translation of the relevant part, p. 1, lines 20-30 of the Office Action.

JPOA—Office Action of Japanese Patent Application No. 2011-040673 dated Dec. 22, 2015 with English translation of the relevant part, from p. 1, line 21 to p. 2, line 12 of the Office Action.

* cited by examiner

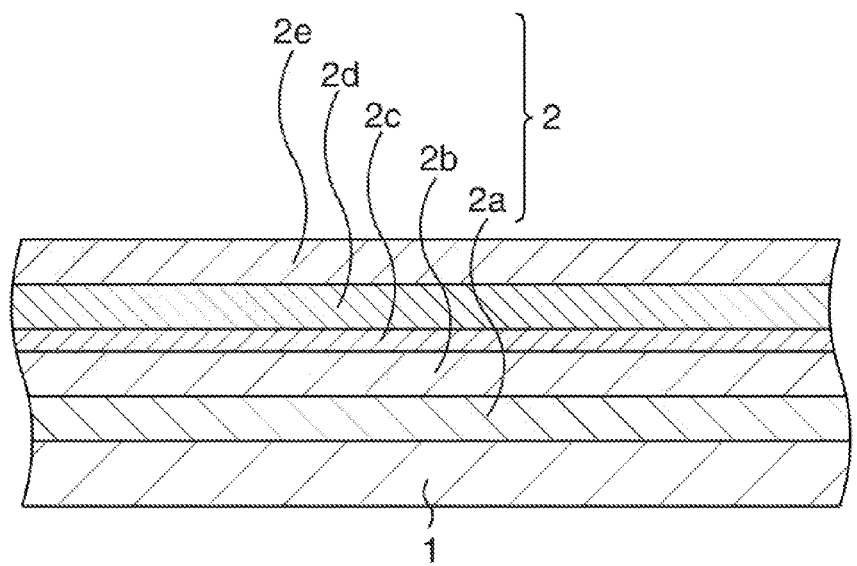
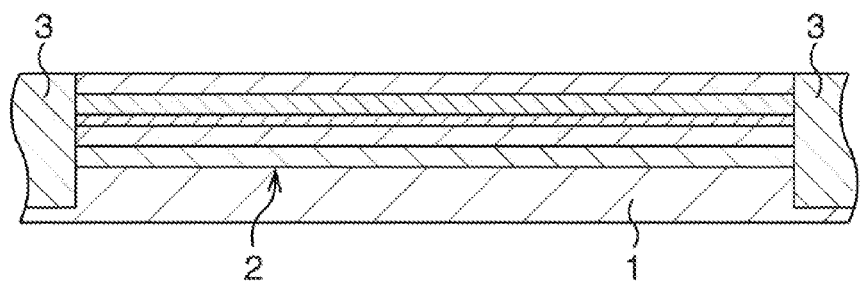
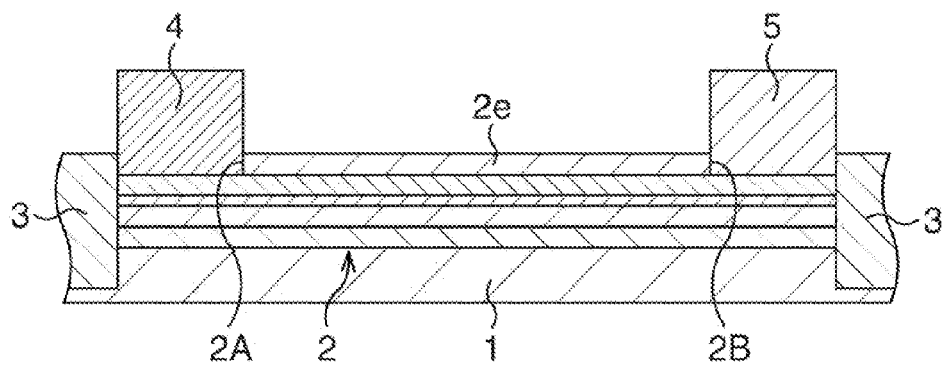

US 9,496,380 B2

COMPOUND SEMICONDUCTOR DEVICE COMPRISING COMPOUND SEMICONDUCTOR LAYERED STRUCTURE HAVING BUFFER LAYER AND METHOD OF MANUFACTURING THE SAME

CROSS-REFERENCE TO RELATED APPLICATION

This application is based upon and claims the benefit of priority of the prior Japanese Patent Application No. 2011-040673, filed on Feb. 25, 2011, the entire contents of which are incorporated herein by reference.

FIELD

The embodiments discussed herein are directed to a compound semiconductor device and a manufacturing method thereof.

BACKGROUND

An application of a nitride semiconductor to a high-withstand voltage and high-power semiconductor device has been studied by using characteristics such as high saturation electron speed and a wide band gap thereof. For example, a band gap of GaN being the nitride semiconductor is 3.4 eV, which is larger than the band gap (1.1 eV) of Si and the band gap (1.4 eV) of GaAs, and it has high breakdown electric field intensity. Accordingly, GaN is extremely expectable as a material of a power semiconductor device capable of high voltage operation and high-power.

Many reports have been made as for a field-effect transistor, in particular, a High Electron Mobility Transistor (HEMI) as the semiconductor device using the nitride semiconductor. For example, in a GaN based HEMI (GaN-HEMT), an AlGaN/GaN.HEMT in which GaN is used as an electron transit layer and AlGaN is used as an electron supply layer is focused. In the AlGaN/GaN.HEMT, distortion resulting from a lattice constant difference between GaN and AlGaN occurs at AlGaN. High-concentration two-dimensional electron gas (2DEG) is obtained by piezoelectric polarization generated by the distortion and spontaneous polarization of AlGaN. Accordingly, it is expected as a high-withstand voltage power device for a switch element, an electric vehicle, and so on.

It is an important issue common to a semiconductor device using a nitride semiconductor to reduce an off-leakage current. GaN is easy to turn into n-type resulting from crystal defect, mixture of impurities or the like, and it is a problem in which leakage of current occurs via a part of a channel region of GaN being a buffer layer or the electron transit layer. A method in which an impurity such as Fe is doped when the buffer layer grows to make it high resistance is cited as a method to reduce the off-leakage current. However, the buffer layer in a crystal growth is extremely important, and there is a problem in which crystallinity of the electron transit layer, the electron supply layer, and so on is deteriorated, and deterioration of device characteristics is incurred by making the buffer layer into an impurity doping layer.

[Patent Document 1] Japanese Laid-open Patent Publication No. 2007-251144

SUMMARY

According to an aspect of a compound semiconductor device, the compound semiconductor device includes: a compound semiconductor layered structure, and wherein a region of which resistance value is higher than the other portion of a buffer layer is locally formed at least at the buffer layer of the compound semiconductor layered structure.

An aspect of a manufacturing method of a compound semiconductor device includes: introducing an impurity into at least a buffer layer of a compound semiconductor layered structure from a rear surface of the compound semiconductor layered structure to make a resistance value of the buffer layer high.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A to FIG. 1C are schematic sectional views illustrating a manufacturing method of an AlGaN/GaN.HEMT according to a first embodiment in process sequence;

DESCRIPTION OF EMBODIMENTS

First Embodiment

Figure 2A:
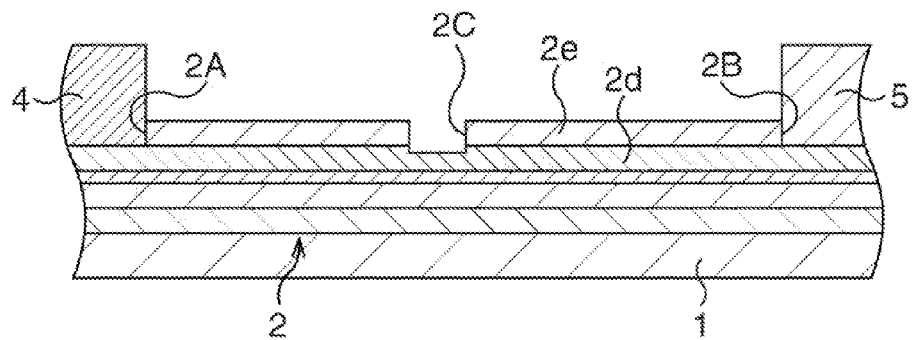
FIG. 2A to FIG. 2C are schematic sectional views illustrating the manufacturing method of the AlGaN/GaN.HEMT according to the first embodiment in process sequence subsequent to FIG. 1C.

In the present embodiment, an AlGaN/GaN.HEMT being a nitride semiconductor is disclosed as a compound semiconductor device.

FIG. 1A to FIG. 4B are schematic sectional views illustrating a manufacturing method of the AlGaN/GaN.HEMT according to a first embodiment in process sequence.

At first, as illustrated in FIG. 1A, a compound semiconductor layered structure 2 is formed on, for example, an Si substrate 1 as a substrate for growth. An SiC substrate, a sapphire substrate, a GaAs substrate, a GaN substrate, and so on may be used as the substrate for growth instead of the Si substrate. Besides, the substrate may either be semi-insulating or conductive.

The compound semiconductor layered structure 2 is made up by including a buffer layer 2a, an electron transit layer 2b, an intermediate layer 2c, an electron supply layer 2d, and a cap layer 2e.

In a completed AlGaN/GaN.HEMT, two-dimensional electron gas (2DEG) is generated in a vicinity of a boundary face of the electron transit layer 2b with the electron supply layer 2d (intermediate layer 2c to be accurate) at an operation time thereof. This 2DEG is generated based on a difference of lattice constants between a compound semiconductor (here, GaN) of the electron transit layer 2b and a compound semiconductor (here, AlGaN) of the electron supply layer 2d.

In detail, the following respective compound semiconductors are grown by, for example, a Metal Organic Vapor Phase Epitaxy (MOVPE) method on the Si substrate 1. A Molecular Beam Epitaxy (MBE) method and so on may be used instead of the MOVPE method.

AlN is grown for a thickness of approximately 5 nm, "i" (intentionally undoped)-GaN is grown for a thickness of approximately 1 μm, i-AlGaN is grown for a thickness of approximately 5 nm, n-AlGaN is grown for a thickness of approximately 30 nm, and n-GaN is grown for a thickness of approximately 3 nm in sequence on the Si substrate 1. Accordingly, the buffer layer 2a, the electron transit layer 2b, the intermediate layer 2c, the electron supply layer 2d, and the cap layer 2e are formed. As the buffer layer 2a, AlGaN may be used instead of AlN, or GaN may be grown by means of low temperature growth.

As growth conditions of AlN, GaN, and AlGaN, mixed gas of trimethylaluminum gas, trimethylgallium gas, and ammonia gas is used as source gas. Presence/absence of supply and flow rate of trimethylaluminum gas being an Al source, trimethylgallium gas being a Ga source are appropriately set according to a growing compound semiconductor layer. A flow rate of ammonia gas being a common material is set at approximately 100 ccm to 10 LM. Besides, a growth pressure is approximately 50 Torr to 300 Torr, and a growth temperature is approximately 1000° C. to 1200° C.

When GaN, AlGaN are grown as the n-type, for example, $SiH_4$ gas containing, for example, Si as an n-type impurity is added to the source gas with a predetermined flow rate, to dope Si into GaN and AlGaN. A doping concentration of Si is set to be approximately $1 \times 10^{18}$/cm$^3$ to approximately $1 \times 10^{20}$/cm$^3$, for example, approximately $5 \times 10^{18}$/cm$^3$.

Subsequently, an element isolation structure 3 is formed as illustrated in FIG. 1B. The element isolation structure 3 is not illustrated in FIG. 2A and later.

In detail, for example, argon (Ar) is implanted into an element isolation region of the compound semiconductor layered structure 2. The element isolation structure 3 is thereby formed at the compound semiconductor layered structure 2 and at a surface layer portion of the Si substrate 1. An active region is defined on the compound semiconductor layered structure 2 by the element isolation structure 3.

Note that the element isolation may be performed by using, for example, an STI (Shallow Trench Isolation) method instead of the above-stated implantation method. At this time, for example, chlorine etching gas is used for the dry etching of the compound semiconductor layered structure 2.

Subsequently, a source electrode 4 and a drain electrode 5 are formed as illustrated in FIG. 1C.

In detail, at first, electrode recesses 2A, 2B are formed at formation planned positions (electrode formation planned positions) of the source electrode and the drain electrode at a surface of the compound semiconductor layered structure 2.

A resist is coated on the surface of the compound semiconductor layered structure 2. The resist is processed by lithography to form openings exposing the surfaces of the compound semiconductor layered structure 2 corresponding to the electrode formation planned positions. A resist mask having the openings is thereby formed.

The electrode formation planned positions of the cap layer 2e are dry-etched and removed by using this resist mask until a surface of the electron supply layer 2d exposes. Accordingly, the electrode recesses 2A, 2B exposing the electrode formation planned positions at the surface of the electron supply layer 2d are formed. As etching conditions, inert gas such as Ar and chlorine gas such as $Cl_2$ are used as etching gas, and for example, a flow rate of $Cl_2$ is set to be 30 sccm, a pressure is set to be 2 Pa, and an RF input power is set to be 20 W. Note that the electrode recesses 2A, 2B may be formed by etching to a middle of the cap layer 2e, or formed by etching to the electron supply layer 2d or more.

The resist mask is removed by asking and so on.

A resist mask to form the source electrode and the drain electrode is formed. Here, for example, a two-layer resist in eaves structure suitable for a vapor deposition method and a lift-off method is used. This resist is coated on the compound semiconductor layered structure 2 to form openings exposing the electrode recesses 2A, 2B. The resist mask having the openings is thereby formed.

For example, Ta/Al are deposited as electrode materials on the resist mask including inside the openings exposing the electrode recesses 2A, 2B by, for example, the vapor deposition method by using the resist mask. A thickness of Ta is approximately 20 nm, and a thickness of Al is approximately 200 nm. The resist mask and the Ta/Al deposited thereon are removed by the lift-off method. After that, a heat treatment is performed for the Si substrate 1 in, for example, nitrogen atmosphere at a temperature of approximately 400° C. to 1000° C., for example, at approximately 600° C. to bring the remained Ta/Al into ohmic contact with the electron supply layer 2d. There is a case when the heat treatment is not necessary as long as the ohmic contact between Ta/Al and the electron supply layer 2d can be obtained. The source electrode 4 and the drain electrode 5 embedding the electrode recesses 2A, 2B with a part of the electrode materials are thereby formed.

Subsequently, an electrode recess 2C of a gate electrode is formed at the compound semiconductor layered structure 2 as illustrated in FIG. 2A.

In detail, at first, a resist is coated on the surface of the compound semiconductor layered structure 2. The resist is processed by lithography to form an opening exposing the surface of the compound semiconductor layered structure 2 corresponding to a formation planned position (electrode formation planned position) of the gate electrode. A resist mask having the opening is thereby formed.

The cap layer 2e and a part of the electron supply layer 2d at the electrode formation planned position are dry-etched and removed by using the resist mask. The electrode recess 2C dug into the cap layer 2e and the part of the electron supply layer 2d is thereby formed. As the etching conditions, the inert gas such as Ar and the chlorine gas such as $Cl_2$ are used as the etching gas, and for example, the flow rate of $Cl_2$ is set to be 30 sccm, the pressure is set to be 2 Pa, and the RF input power is set to be 20 W. Note that the electrode recess 2C may be formed by etching to the middle of the cap layer 2e, or formed by etching to a deeper portion of the electron supply layer 2d.

The resist mask is removed by the asking and so on.

Figure 2B:
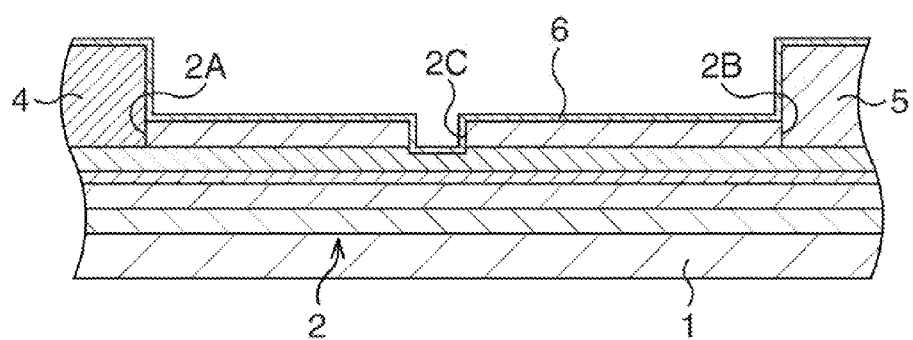

Subsequently, a gate insulating film 6 is formed as illustrated in FIG. 2B.

In detail, for example, $Al_2O_3$ is deposited on the compound semiconductor layered structure 2 as an insulating material so as to cover an internal surface of the electrode recess 2C. $Al_2O_3$ is deposited by, for example, an Atomic Layer Deposition method (ALD method) for a film thickness of approximately 2 nm to 200 nm, here for approximately 10 nm. The gate insulating film 6 is thereby formed.

Note that the deposition of $Al_2O_3$ may be performed by, for example, a plasma CVD method, a sputtering method, or the like instead of the ALD method. Besides, a nitride or an oxynitride of Al may be used instead of depositing $Al_2O_3$. An oxide, a nitride, or an oxynitride of Si, Hf, Zr, Ti, Ta, W may be used other than the above, otherwise, the above-stated materials are appropriately selected to be deposited in multi-layer, to form the gate insulating film.

Figure 2C:
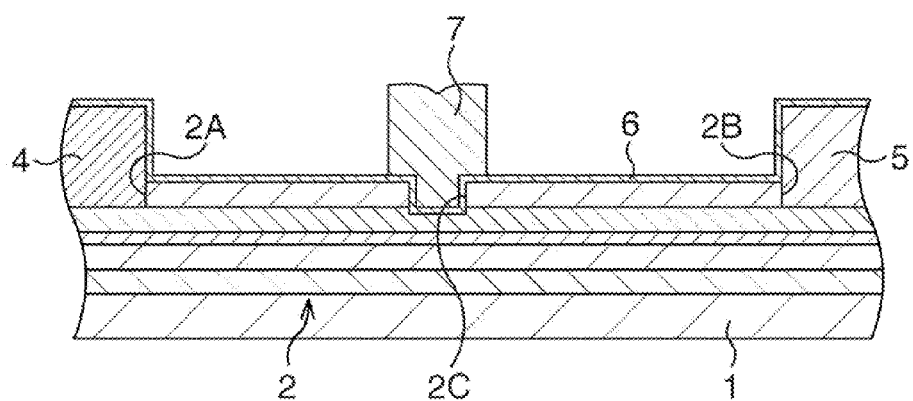

Subsequently, a gate electrode 7 is formed as illustrated in FIG. 2C.

In detail, at first, a resist mask to form the gate electrode is formed. Here, for example, the two-layer resist in eaves structure suitable for the vapor deposition method and the lift-off method is used. This resist is coated on the gate insulating film 6 to form an opening exposing a portion of the electrode recess 2C of the gate insulating film 6. The resist mask having the opening is thereby formed.

For example, Ni/Au are deposited as the electrode materials on the resist mask including inside the opening exposing the portion of the electrode recess 2C of the gate insulating film 6 by, for example, the vapor deposition method by using the resist mask. A thickness of Ni is approximately 30 nm, a thickness of Au is approximately 400 nm. The resist mask and Ni/Au deposited thereon are removed by the lift-off method. The gate electrode 7 embedding inside the electrode recess 2C with a part of the electrode materials via the gate insulating film 6 is thereby formed.

In the present embodiment, an MIS type AlGaN/GaN-.HEMT having the gate insulating film 6 is exemplified, but a schottky type AlGaN/GaN.HEMT in which the gate electrode 7 is directly in contact with the compound semiconductor layered structure 2 without having the gate insulating film 6 may be manufactured.

Besides, the gate electrode may be formed on the compound semiconductor layered structure 2 without any recess via the gate insulating film or directly, without applying a gate recess structure forming the gate electrode 7 inside the electrode recess 2C.

Figure 3A:
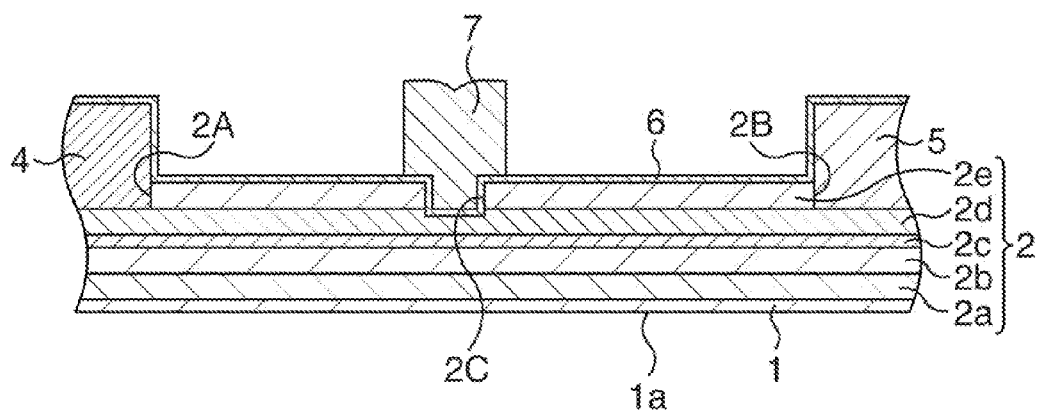
FIG. 3A and FIG. 3B are schematic sectional views illustrating the manufacturing method of the AlGaN/GaN.HEMT according to the first embodiment in process sequence subsequent to FIG. 2C.
Figure 4A:
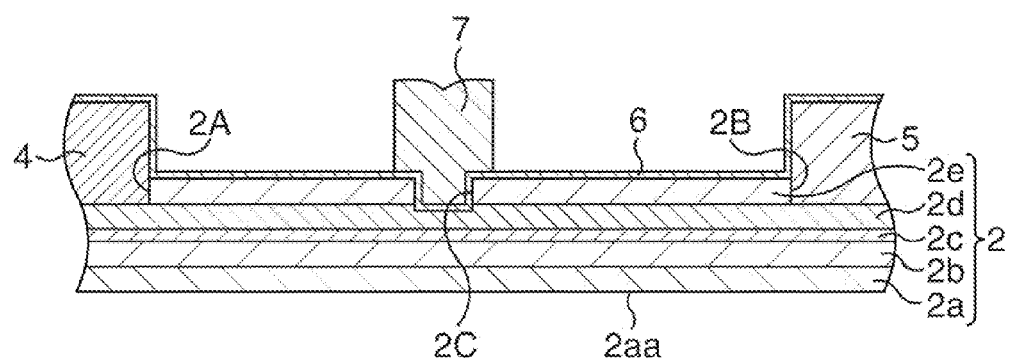
FIG. 4A and FIG. 4B are schematic sectional views illustrating the manufacturing method of the AlGaN/GaN.HEMT according to the first embodiment in process sequence subsequent to FIG. 2C.

Subsequently, a thickness of a rear surface 1a of the Si substrate 1 is reduced as illustrated in FIG. 3A or FIG. 4A.

In detail, the Si substrate 1 is processed by, for example, a Chemical Mechanical Polishing (CMP), dry-etching, wet-etching, or the like from the rear surface 1a, and the thickness thereof is reduced to a predetermined thickness within a range of approximately "0" (zero) μm to 50 μm. The thickness of "0" (zero) μm means a state in which the Si substrate 1 is completely removed. When the complete removal of the Si substrate 1 is performed, it is enabled by the dry-etching using, for example, fluorine based gas as the etching gas and a rear surface of the buffer layer 2a is made to be an etching stopper. Besides, it is possible to selectively completely remove the Si substrate 1 relative to the buffer layer 2a by the wet-etching using a mixed liquid of, for example, hydrofluoric acid and nitric acid as etching liquid.

A case when the Si substrate 1 is remained for the thickness of, for example, approximately 50 μm is illustrated in FIG. 3A, and a case when the Si substrate 1 is completely removed is illustrated in FIG. 4A respectively.

Figure 3B:
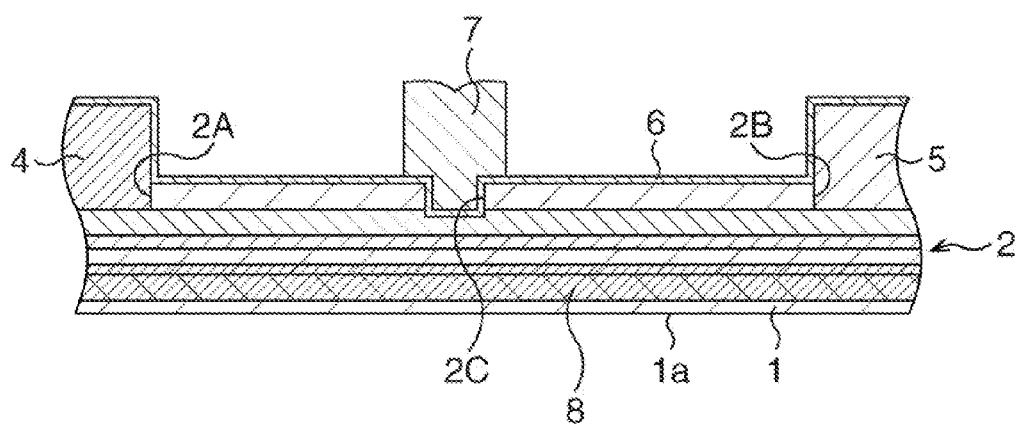
Figure 4B:
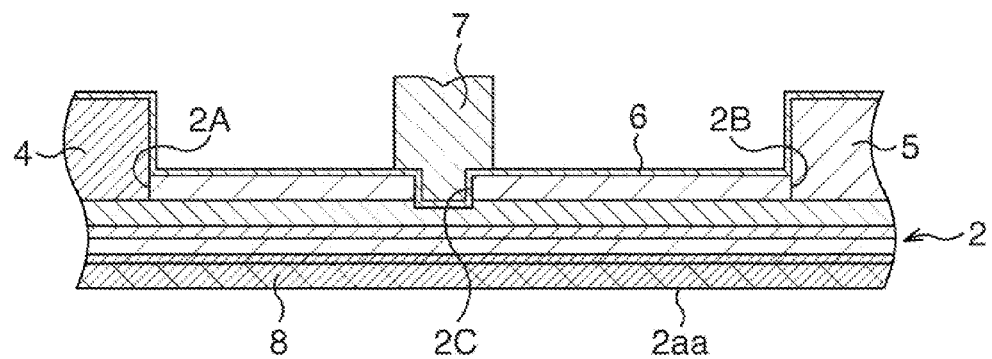

Subsequently, an impurity is ion-implanted into the rear surface 1a of the Si substrate 1 or a rear surface 2aa of the buffer layer 2a as illustrated in FIG. 3B or FIG. 4B.

In detail, the impurity to make the buffer layer 2a high-resistance (increase an electrical resistance value) is ion-implanted into the rear surface 1a of the Si substrate 1 or the rear surface 2aa of the buffer layer 2a. The impurity is introduced into the buffer layer 2a and a part of the electron transit layer 2b from the rear surface 1a or the rear surface 2aa by this ion-implantation, and a high-resistance region 8 is formed at an introduced portion. At least one kind selected from each ion of Fe, C, B, Ti Cr, here, Fe ion is used as the impurity. Ion-implantation conditions are, for example, a dose amount is approximately $1 \times 10^{13}/cm^2$ to $1 \times 10^{15}/cm^2$, and an acceleration energy is approximately 50 keV to 1000 keV.

A case when the ion-implantation is performed from the rear surface 1a of the Si substrate 1 subsequent to FIG. 3A is illustrated in FIG. 3B, and a case when the ion-implantation is performed from the rear surface 2aa of the buffer layer 2a subsequent to FIG. 4A is illustrated in FIG. 4B, respectively. In case of FIG. 3A, it is necessary to set an acceleration energy of Fe ion large for an extent of transmitting through the Si substrate 1.

The acceleration energy of ion-implantation is a determination factor of an implantation depth, and therefore, it may be selected arbitrary in accordance with a thickness of a crystal structure. For example, a case when the respective layers are formed to be respective thicknesses is studied, in which the buffer layer 2a is 5 nm, the electron transit layer 2b is approximately 1 μm, the intermediate layer 2c is approximately 5 nm, the electron supply layer 2d is approximately 30 nm, and the cap layer 2e is approximately 3 nm. In this case, for example, the general implantation depth becomes approximately 200 nm to 300 nm when Fe ion is ion-implanted at the dose amount of approximately $31 \times 10^{14}/cm^2$, the acceleration energy of approximately 500 keV. Accordingly, it is possible to perform the ion-implantation of Fe ion up to the buffer layer 2a and the part of the electron transit layer 2b (at a lower layer portion which does not reach the 2DEG generated in a vicinity of the boundary face of the electron transit layer 2b with the intermediate layer 2c) to make it high-resistance.

In the AlGaN/GaN.HEMT, the buffer layer 2a becomes a main portion to be a path of an off-leakage current. Accordingly, the high-resistance region 8 is formed so as to include the buffer layer 2a (from the buffer layer 2a to the part of the electron transit layer 2b) to make it high resistance, and thereby, it is possible to efficiently and surely suppress the off-leakage current.

Note that a series of processes of FIG. 3A and FIG. 3B (or FIG. 4A and FIG. 4B) is not limited to be performed after the formation of the gate electrode 7. For example, the processes may be performed just after the compound semiconductor layered structure 2 is grown and formed.

Besides, particularly when the Si substrate 1 is completely removed in FIG. 3A, it is conceivable that a damage and so on of elements is prevented by covering a predetermined reinforcing member on the elements in, for example, a dicing process and so on subsequent to the process.

After that, the AlGaN/GaN.HEMT according to the present embodiment is formed by going through respective processes of a formation of an interlayer insulating film, a formation of wirings connected to the source electrode 4, the drain electrode 5, and the gate electrode 7, a formation of a protective film of an upper layer, and a formation of connecting electrodes exposing at an uppermost surface, and so on.

As stated above, the high resistance of the buffer layer 2a (the formation of the high-resistance region 8) is enabled by the ion-implantation in the present embodiment. The high resistance region 8 is formed up to the buffer layer 2a and the part of the electron transit layer 2b in a depth direction from the rear surface 1a or 2aa, and is not formed at an upper layer portion of the electron transit layer 2b, and the intermediate layer 2c and the electron supply layer 2d at above the electron transit layer 2b. Accordingly, there is not a worry about deteriorating the crystallinity of the electron transit layer 2b, the electron supply layer 2d, and so on different from the case when Fe or the like is doped when the buffer layer grows.

Namely, according to the present embodiment, the high-reliable and high-withstand voltage AlGaN/GaN.HEMT is enabled by making the buffer layer 2a high-resistance to surely suppress the off-leakage current while maintaining the crystal quality of the compound semiconductor at the upper layer without doping the impurity to make it high resistance at the crystal growth time of the buffer layer 2a.

Second Embodiment

In the present embodiment, a configuration and a manufacturing method of an AlGaN/GaN.HEMT are disclosed as same as the first embodiment, but they are different in a point in which the ion-implantation process to form the high-resistance region is different. Note that the same reference numerals and symbols are used to designate the same components and so on as the first embodiment, and the detailed description is not given.

FIG. 5A to FIG. 5C and FIG. 6A to FIG. 6C are schematic sectional views illustrating main processes of the manufacturing method of the AlGaN/GaN.HEMT according to a second embodiment.

In the present embodiment, at first, the respective processes of FIG. 1A to FIG. 2C are gone through as same as the first embodiment. At this time, the gate electrode 7 is formed via the gate insulating film 6 inside the electrode recess 2C of the compound semiconductor layered structure 2.

Subsequently, the process of FIG. 3A or FIG. 4A is performed as same as the first embodiment. The Si substrate 1 is thereby remained for the predetermined thickness (FIG. 3A) or completely removed (FIG. 4A).

Figure 5A:
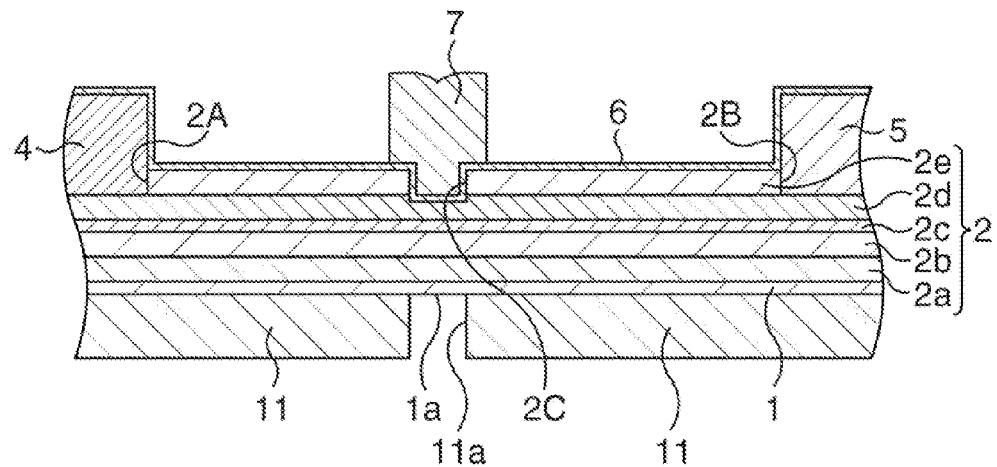
FIG. 5A to FIG. 5C are schematic sectional views illustrating major processes of a manufacturing method of an AlGaN/GaN.HEMT according to a second embodiment.
Figure 6A:
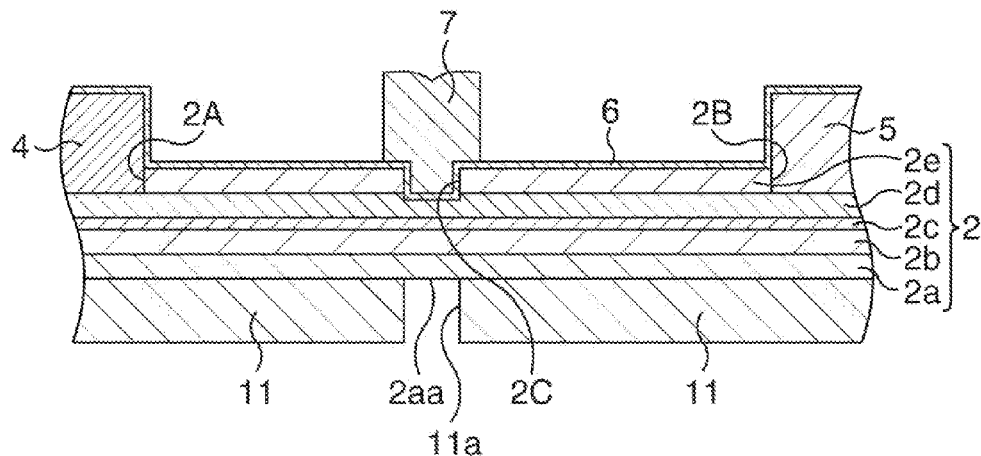
FIG. 6A to FIG. 6C are schematic sectional views illustrating the major processes of the manufacturing method of the AlGaN/GaN.HEMT according to the second embodiment.

Subsequently, a resist mask 11 is formed at the rear surface 1a of the Si substrate 1 or the rear surface 2aa of the buffer layer 2a, as illustrated in FIG. 5A or FIG. 6A.

In detail, a resist is coated on the rear surface 1a of the Si substrate 1 or the rear surface 2aa of the buffer layer 2a, and it is processed by lithography. The resist mask 11 having an opening 11a exposing a portion position matching with the gate electrode 7 of the rear surface 1a of the Si substrate 1 or the rear surface 2aa of the buffer layer 2a, namely, a portion position matching with a channel is thereby formed.

A case when the resist mask 11 is formed on the rear surface 1a of the Si substrate 1 is illustrated in FIG. 5A, and a case when the resist mask 11 is formed on the rear surface 2aa of the buffer layer 2a is illustrated in FIG. 6A, respectively.

Figure 5B:
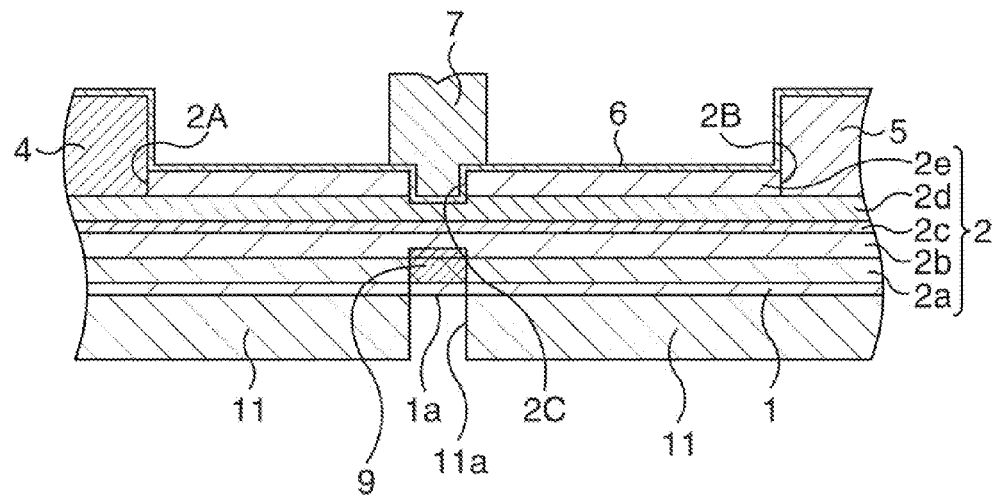
Figure 6B:
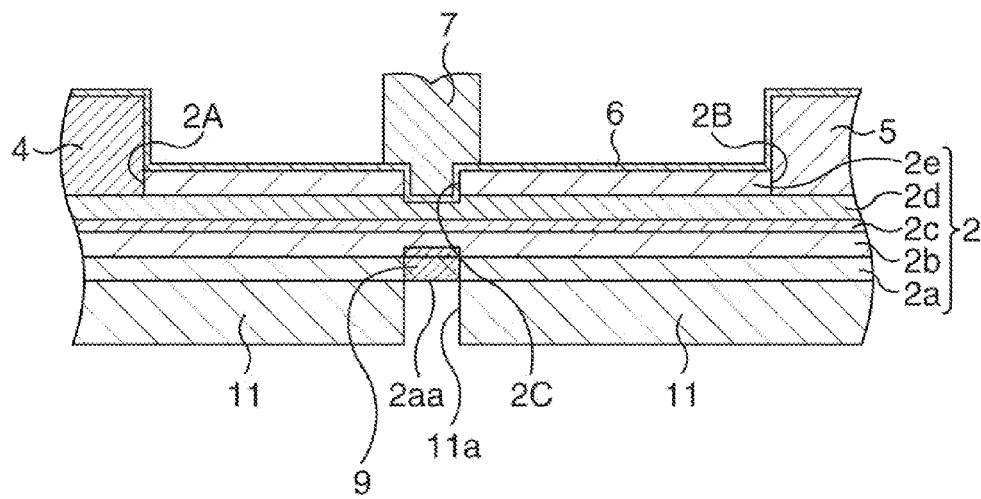

Subsequently, the impurity is ion-implanted into the rear surface 1a of the Si substrate 1 or the rear surface 2aa of the buffer layer 2a, as illustrated in FIG. 5B or FIG. 6B.

In detail, the impurity to make the buffer layer 2a high resistance is ion-implanted into the rear surface 1a of the Si substrate 1 or the rear surface 2aa of the buffer layer 2a by using the resist mask 11 as a mask for the ion-implantation. The impurity is introduced into the buffer layer 2a and the part of the electron transit layer 2b from the rear surface 1a exposing to the opening 11a or from the rear surface 2aa exposing to the opening 11a by this ion-implantation. A local high-resistance region 9 is thereby formed at the buffer layer 2a and the part of the electron transit layer 2b being a portion matching with the opening 11a. At least one kind selected from each ion of Fe, C, B, Ti, Cr, here Fe ion is used as the impurity. As the ion implantation conditions, for example, the dose amount is set to be approximately $1 \times 10^{13}/cm^2$ to $1 \times 10^{15}/cm^2$, and the acceleration energy is set to be approximately 50 keV to 1000 keV.

In the AlGaN/GaN.HEMT, the buffer layer 2a becomes the main portion to be the path of the off-leakage current. Accordingly, the high-resistance region 9 is formed so as to include the buffer layer 2a (from the buffer layer 2a to the part of the electron transit layer 2b) to make it high resistance, and thereby, it is possible to efficiently and surely suppress the off-leakage current.

A case when the ion-implantation is performed from the rear surface 1a of the Si substrate 1 subsequent to FIG. 5A is illustrated in FIG. 5B, and a case when the ion-implantation is performed from the rear surface 2aa of the buffer layer 2a subsequent to FIG. 6A is illustrated in FIG. 6B, respectively. In case of FIG. 5A, it is necessary to set the acceleration energy of Fe ion large for the extent of transmitting through the Si substrate 1.

Figure 5C:
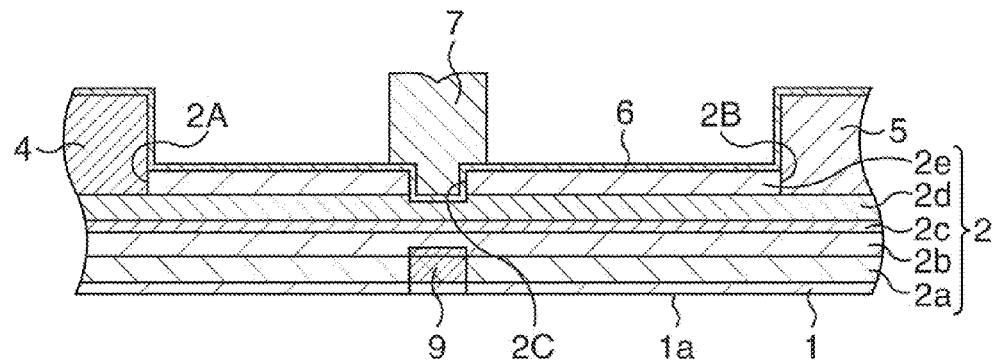
Figure 6C:
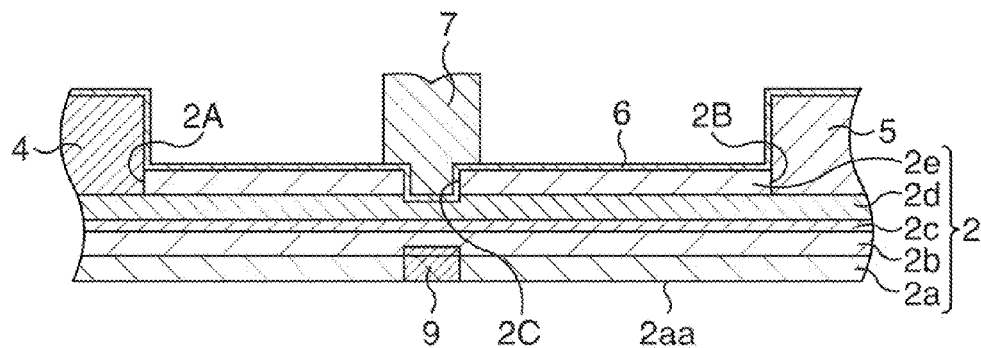

The resist mask 11 is removed by the asking, the wet-etching, or the like. A formation state illustrated in FIG. 5C or FIG. 6C is obtained as stated above.

Note that a series of processes of FIG. 3A, FIG. 5A and FIG. 5B (or FIG. 4A, FIG. 6A and FIG. 6B) is not limited to be performed after the formation of the gate electrode 7. For example, the processes may be performed just after the compound semiconductor layered structure 2 is grown and formed.

After that, the AlGaN/GaN.HEMT according to the present embodiment is formed by going through the respective processes of the formation of the interlayer insulating film, the formation of the wirings connected to the source electrode 4, the drain electrode 5, and the gate electrode 7, the formation of the protective film of the upper layer, the formation of the connecting electrodes exposing at the uppermost surface, and so on.

As stated above, the high resistance of the buffer layer 2a (the formation of the high-resistance region 9) is enabled by the ion-implantation in the present embodiment. The high resistance region 9 is formed up to the buffer layer 2a and the part of the electron transit layer 2b in the depth direction from the rear surface 1a or 2aa, and is not formed at the upper layer portion of the electron transit layer 2b, the intermediate layer 2c, and the electron supply layer 2d at above the electron transit layer 2b. Accordingly, there is not a worry about deteriorating the crystallinity of the electron transit layer 2b, the electron supply layer 2d, and so on different from the case when Fe or the like is doped when the buffer layer grows.

Besides, the high-resistance region 9 is locally formed only at a portion position matching with a channel region at upward in a width direction. The portion mainly corresponding to below the channel region among the buffer layer 2a can be the path of the off-leakage current. In the present embodiment, it is possible to suppress crystal breakage caused by the ion-implantation of the buffer layer 2a as much as possible, and to effectively suppress the off-leakage current, because the high-resistance region 9 is formed at the corresponding portion.

Namely, according to the present embodiment, necessary portions of the buffer layer 2a are locally made to be high resistance to suppress the crystal breakage as much as possible and to surely suppress the off-leakage current while maintaining the crystal quality of the compound semiconductor at the upper layer without doping the impurity to make it high resistance at the crystal growth time of the buffer layer 2a. The high-reliable and high-withstand voltage AlGaN/GaN.HEMT having the above-stated effects is enabled.

Note that the high-resistance region 9 may be formed by performing the ion-implantation at an arbitrary local portion of the rear surface 1a or the rear surface 2aa without being limited to the position matching portion at downward of the gate electrode 7. The above-stated respective effects can be obtained in this configuration.

Third Embodiment

In the present embodiment, a configuration and a manufacturing method of an AlGaN/GaN.HEMT are disclosed as same as the first embodiment, but they are different in a point in which the ion-implantation process to form the high-resistance region is different. Note that the same reference numerals and symbols are used to designate the same components and so on as the first embodiment, and the detailed description is not given.

FIG. 7 to FIG. 9B are schematic sectional views illustrating main processes of the manufacturing method of the AlGaN/GaN.HEMT according to a third embodiment.

In the present embodiment, at first, the respective processes of FIG. 1A to FIG. 2C are gone through as same as the first embodiment. At this time, the gate electrode 7 is formed via the gate insulating film 6 inside the electrode recess 2C of the compound semiconductor layered structure 2.

Figure 7:
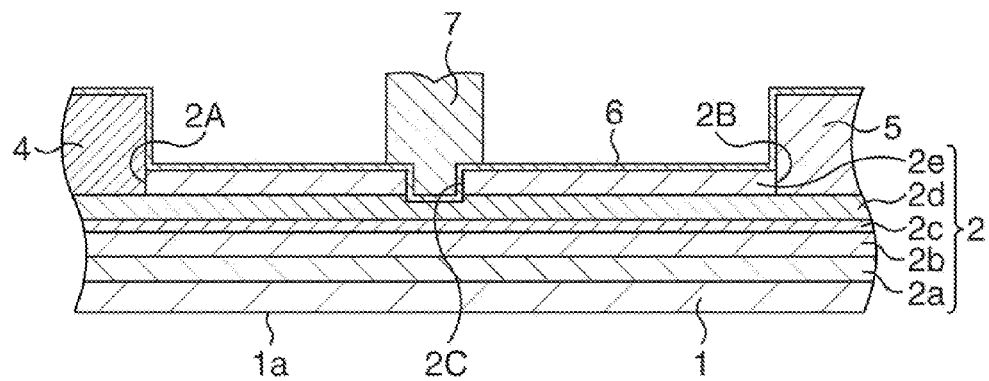
FIG. 7 is a schematic sectional view illustrating a major process of a manufacturing method of an AlGaN/GaN.HEMT according to a third embodiment.

Subsequently, the thickness of the rear surface 1a of the Si substrate 1 is reduced as illustrated in FIG. 7.

In detail, the Si substrate 1 is processed by, for example, the CMP, dry-etching, wet-etching, or the like from the rear surface 1a, and the thickness thereof is reduced to the predetermined thickness within the range of approximately 50 µm to 100 µm, for example, reduced to approximately 50 µm.

Figure 8A:
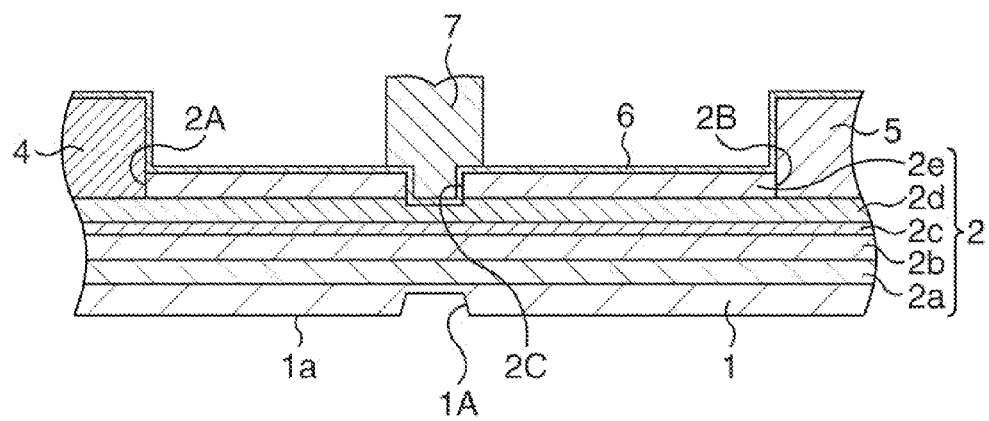
FIG. 8A and FIG. 8B are schematic sectional views illustrating the major processes of the manufacturing method of the manufacturing method of the AlGaN/GaN.HEMT according to the third embodiment subsequent to FIG. 7.
Figure 9A:
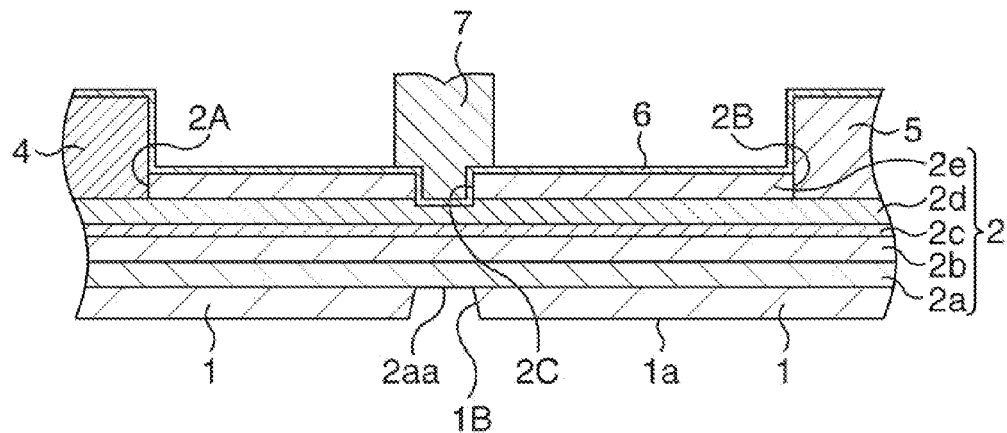
FIG. 9A and FIG. 9B are schematic sectional views illustrating the major processes of the manufacturing method of the AlGaN/GaN.HEMT according to the third embodiment subsequent to FIG. 7.

Subsequently, a recess 1A or an opening 1B is formed as a recessed portion at the rear surface 1a of the Si substrate 1 as illustrated in FIG. 8A or FIG. 9A.

In detail, the rear surface 1a of the Si substrate 1 is processed by, for example, a Bosch process. The Bosch process is a deep etching technology of Si with high aspect ratio in which sidewall deposition gas and etching gas are alternately supplied. The normal lithography and the dry-etching may be used instead of the Bosch process. The recessed portion is thereby formed at a portion position matching with the gate electrode 7 of the rear surface 1a of the Si substrate 1, namely at a portion position matching with the channel. The recessed portion is formed as the recess 1A in which the Si substrate is thinly remained at a bottom part (FIG. 8A), or as the opening 1B exposing a part of the rear surface 2aa of the buffer layer 2a (FIG. 9A).

Figure 8B:
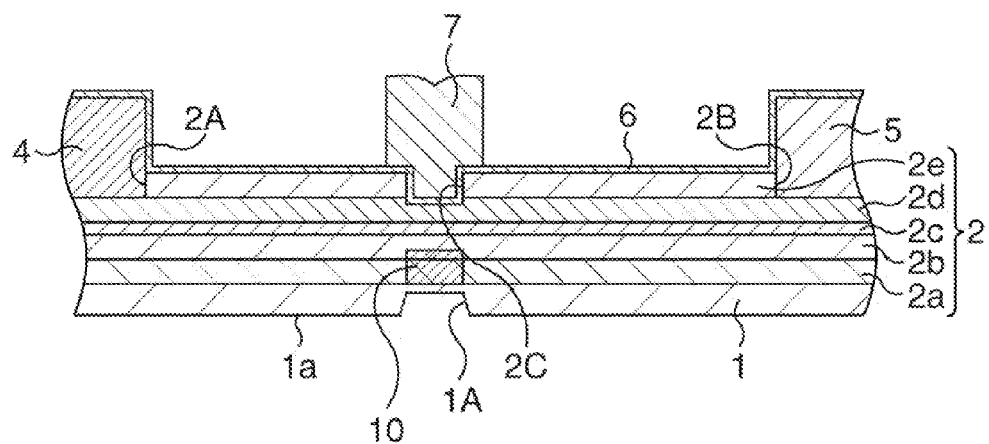
Figure 9B:
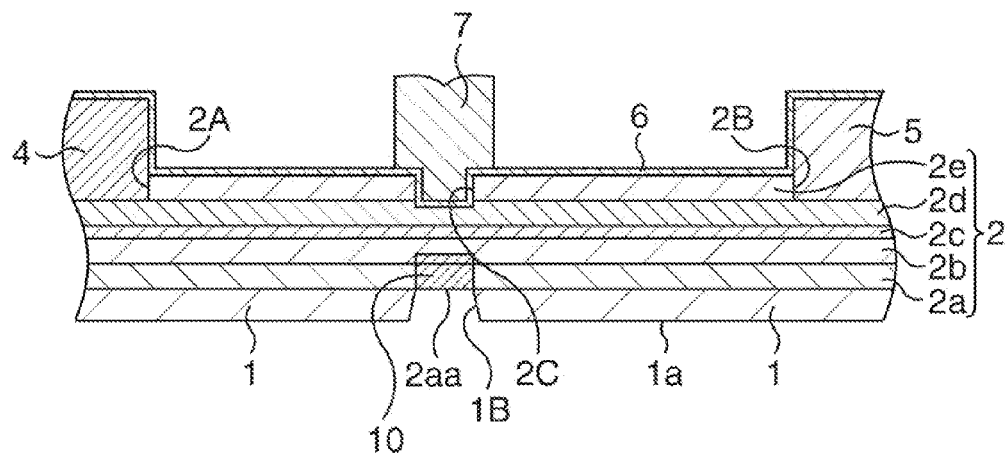

Subsequently, the impurity is ion-implanted into the rear surface 1a of the Si substrate 1 as illustrated in FIG. 8B or FIG. 9B.

In detail, the impurity to make the buffer layer 2a high-resistance is ion-implanted into the rear surface 1a of the Si substrate 1 by using the Si substrate 1 as a mask of the ion-implantation. The impurity is introduced into the buffer layer 2a and the part of the electron transit layer 2b by this ion-implantation from the recess 1A of the Si substrate 1 while transmitting through the portion remaining at the bottom part, or from the opening 1B. A local high-resistance region 10 is thereby formed at the buffer layer 2a and the part of the electron transit layer 2b being a portion matching with the recess 1A or the opening 1B. At least one kind selected from each ion of Fe, C, B, Ti, Cr, here, Fe ion is used as the impurity. The ion-implantation conditions are, for example, the dose amount is approximately $1 \times 10^{13}/cm^2$ to $1 \times 10^{15}/cm^2$, and the acceleration energy is approximately 50 keV to 1000 keV. The impurity is introduced only to the portion of the recess 1A or the opening 1B because the Si substrate 1 becomes the mask under the ion-implantation conditions as stated above.

In the AlGaN/GaN.HEMT, the buffer layer 2a becomes the main portion to be the path of the off-leakage current. Accordingly, the high-resistance region 10 is formed so as to include the buffer layer 2a (from the buffer layer 2a to the part of the electron transit layer 2b) to make it high resistance, and thereby, it is possible to efficiently and surely suppress the off-leakage current.

A case when the ion-implantation is performed from the recess 1A of the Si substrate 1 subsequent to FIG. 8A is illustrated in FIG. 8B, and a case when the ion-implantation is performed from the opening 1B of the Si substrate 1 subsequent to FIG. 9A is illustrated in FIG. 9B, respectively. In case of FIG. 8A, it is necessary to set the acceleration energy of Fe ion large for the extent of transmitting through the portion of the Si substrate 1 remaining at the bottom part of the recess 1A.

Note that a series of processes of FIG. 7, FIG. 8A and FIG. 8B (or FIG. 7, FIG. 9A and FIG. 9B) is not limited to be performed after the formation of the gate electrode 7. For example, the processes may be performed just after the compound semiconductor layered structure 2 is grown and formed.

After that, the AlGaN/GaN.HEMT according to the present embodiment is formed by going through the respective processes of the formation of the interlayer insulating film, the formation of the wirings connected to the source electrode 4, the drain electrode 5, and the gate electrode 7, the formation of the protective film of the upper layer, and the formation of the connecting electrodes exposing at the uppermost surface, and so on.

As stated above, the high resistance of the buffer layer 2a (the formation of the high-resistance region 10) is enabled by the ion-implantation in the present embodiment. The high resistance region 10 is formed up to the buffer layer 2a and the part of the electron transit layer 2b in the depth direction, and is not formed at the upper layer portion of the electron transit layer 2b, the intermediate layer 2c and the electron supply layer 2d at above the electron transit layer 2b. Accordingly, there is not a worry about deteriorating the crystallinity of the electron transit layer 2b, the electron supply layer 2d, and so on different from the case when Fe or the like is doped when the buffer layer grows.

Besides, the high-resistance region 10 is locally formed only at a portion position matching with a channel region at upward in the width direction. The portion mainly corresponding to below the channel region among the buffer layer 2a can be the path of the off-leakage current. In the present embodiment, it is possible to suppress the crystal breakage of the buffer layer 2a caused by the ion-implantation as much as possible, and to effectively suppress the off-leakage current because the high-resistance region 10 is formed at the corresponding portion.

Besides, the ion-implantation and so on are performed under a state in which the Si substrate 1 is remained for some extent, and therefore, there is no worry in, for example, the dicing process and so on after that, it is advantageous in a point of handling and so on, and a reliable manufacturing of the AlGaN/GaN.HEMT becomes possible.

Namely, according to the present embodiment, the necessary portions of the buffer layer 2a are locally made to be high resistance to suppress the crystal breakage as much as possible and to surely suppress the off-leakage current while maintaining the crystal quality of the compound semiconductor at the upper layer without doping the impurity to make it high resistance at the crystal growth time of the buffer layer 2a. There is no worry at a subsequent process time caused by the absence of the Si substrate 1. The extremely high-reliable and high-withstand voltage AlGaN/GaN.HEMT having the above-stated effects is enabled.

Note that the high-resistance region 10 may be formed by forming a recess or an opening at an arbitrary local portion of the rear surface 1a and performing the ion-implantation without being limited to the position matching portion at downward of the gate electrode 7. The above-stated respective effects can be obtained in this configuration.

Fourth Embodiment

In the present embodiment, a power supply device to which one kind of AlGaN/GaN.HEMT selected from the first to third embodiments is applied is disclosed.

Figure 10:
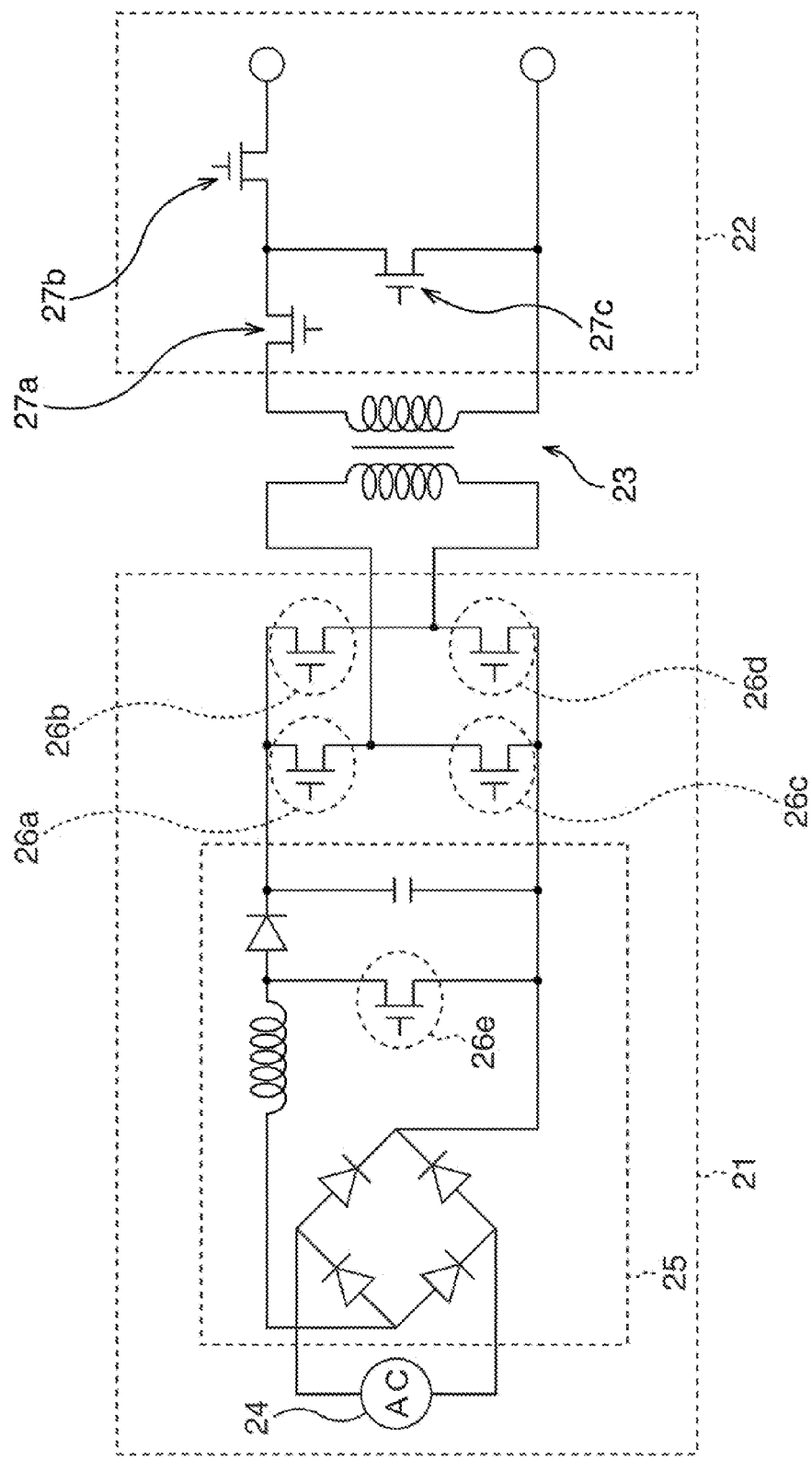
FIG. 10 is a connection diagram illustrating a schematic configuration of a power supply device according to a fourth embodiment.

FIG. 10 is a connection diagram illustrating a schematic configuration of the power supply device according to a fourth embodiment.

The power supply device according to the present embodiment is made up by including a high-pressure primary side circuit 21, a low-pressure secondary side circuit 22, and a transformer 23 arranged between the primary side circuit 21 and the secondary side circuit 22.

The primary side circuit 21 is made up by including an AC power supply 24, so-called a bridge rectifier circuit 25, and plural (here, four pieces of) switching elements 26a, 26b, 26c, and 26d. Besides, the bridge rectifier circuit 25 has a switching element 26e.

The secondary side circuit 22 is made up by including plural (here, three pieces of) switching elements 27a, 27b, and 27c.

In the present embodiment, the switching elements 26a, 26b, 26c, 26d, and 26e of the primary side circuit 21 are the one kind of AlGaN/GaN.HEMT selected from the first to third embodiments. On the other hand, the switching elements 27a, 27b, and 27c of the secondary side circuit 22 are a normal MIS.FET using silicon.

In the present embodiment, the high-reliable and high-withstand voltage AlGaN/GaN.HEMT in which the buffer layer is made high-resistance to surely suppress the off-leakage current while maintaining the crystal quality of the compound semiconductor at the upper layer without doping at the crystal growth time of the buffer layer is applied to a high-voltage circuit. A high-reliable and high-power power supply circuit is thereby enabled.

Fifth Embodiment

In the present embodiment, a high-frequency amplifier to which one kind of AlGaN/GaN.HEMT selected from the first to third embodiments is applied is disclosed.

Figure 11:
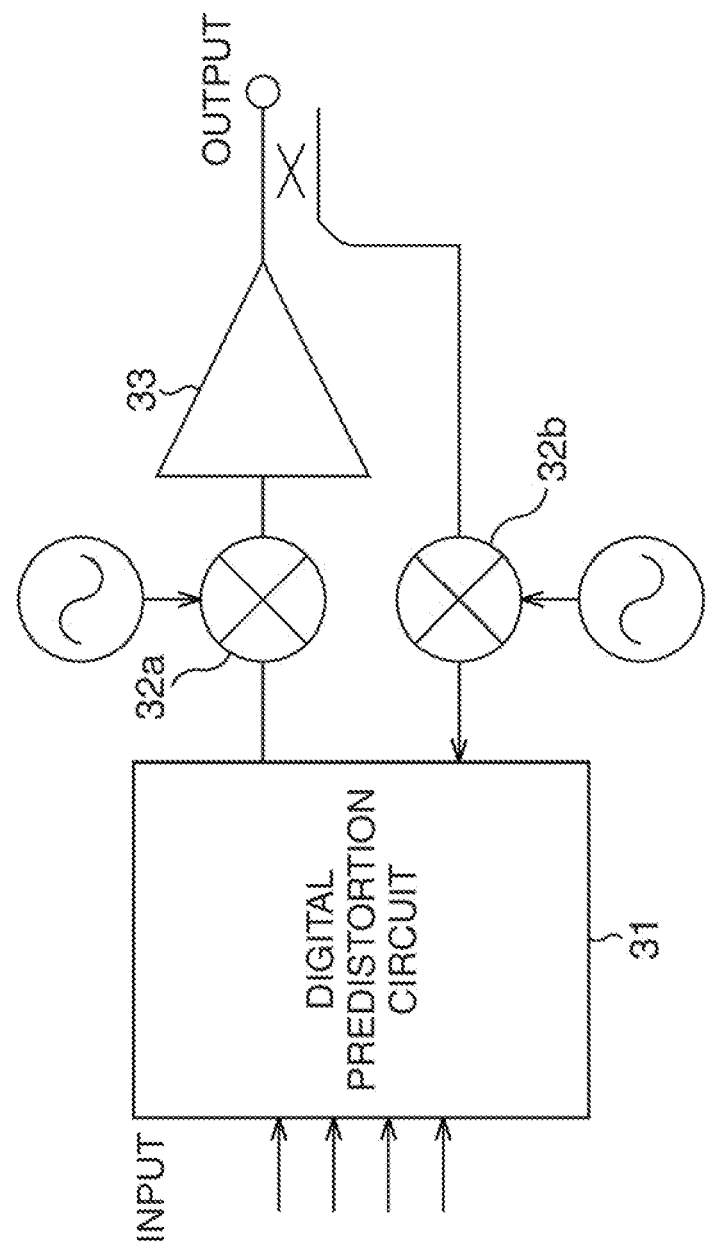
FIG. 11 is a connection diagram illustrating a schematic configuration of a high-frequency amplifier according to a fifth embodiment.

FIG. 11 is a connection diagram illustrating a schematic configuration of the high-frequency amplifier according to a fifth embodiment.

The high-frequency amplifier according to the present embodiment is made up by including a digital predistortion circuit 31, mixers 32a, 32b, and a power amplifier 33.

The digital predistortion circuit 31 is to compensate a nonlinear distortion of an input signal. The mixer 32a is to perform a mixing of the input signal of which nonlinear distortion is compensated and an AC signal. The power amplifier 33 is to amplify the input signal which is performed the mixing with the AC signal, and has one kind of AlGaN/GaN.HEMT selected from the first to third embodiments. Note that in FIG. 11, it is constituted such that a signal at an output side is performed the mixing with the AC signal by the mixer 32b and is transmitted to the digital predistortion circuit 31 by, for example, a switching of a switch.

In the present embodiment, the high-reliable and high-withstand voltage AlGaN/GaN.HEMT in which the buffer layer is made high-resistance to surely suppress the off-leakage current while maintaining the crystal quality of the compound semiconductor at the upper layer without doping at the crystal growth time of the buffer layer is applied to the high-frequency amplifier. A high-reliable and high-withstand voltage high-frequency amplifier is thereby enabled.

Other Embodiments

In the first to fifth embodiments, the AlGaN/GaN.HEMT is exemplified as the compound semiconductor device. As the compound semiconductor device, it is applicable for the HEMTs other than the AlGaN/GaN.HEMT.

—The Other HEMT Example 1

In the present example, an InAlN/GaN.HEMT is disclosed as the compound semiconductor device.

InAlN and GaN are compound semiconductors capable of approximating lattice constants thereof depending on compositions. In this case, the electron transit layer is formed by i-GaN, the intermediate layer is formed by i-InAlN, the electron supply layer is formed by n-InAlN, and the cap layer is formed by n-GaN in the above-stated first to five embodiments. Besides, the piezoelectric polarization in this case is seldom generated, and therefore, the two-dimensional electron gas is mainly generated by the spontaneous polarization of InAlN.

According to the present example, a high-reliable and high-withstand voltage InAlN/GaN.HEMT in which the buffer layer is made high-resistance to surely suppress the off-leakage current while maintaining the crystal quality of the compound semiconductor at the upper layer without doping at the crystal growth time of the buffer layer is enabled as same as the above-stated AlGaN/GaN.HEMT.

—The Other HEMT Example 2

In the present example, an InAlGaN/GaN.HEMT is disclosed as the compound semiconductor device.

Between GaN and InAlGaN, the latter is the compound semiconductor of which lattice constant can be made small depending on the composition compared to the former. In this case, the electron transit layer is formed by i-GaN, the intermediate layer is formed by i-InAlGaN, the electron supply layer is formed by n-InAlGaN, and the cap layer is formed by n-GaN in the above-stated first to five embodiments.

According to the present example, the high-reliable and high-withstand voltage InAlGaN/GaN.HEMT in which the buffer layer is made high-resistance to surely suppress the off-leakage current while maintaining the crystal quality of the compound semiconductor at the upper layer without doping at the crystal growth time of the buffer layer is enabled as same as the above-stated AlGaN/GaN.HEMT.

According to the above-stated respective aspects, a high-reliable and high-withstand voltage compound semiconductor device is enabled, in which a buffer layer is made high-resistance to surely suppress an off-leakage current while maintaining crystal quality of a compound semiconductor at an upper layer without doping an impurity to make it high-resistance at a crystal growth time of the buffer layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A compound semiconductor device, comprising:
    a substrate;
    an electron transit layer formed above the substrate;
    a buffer layer formed between the substrate and the electron transit layer;
    an electron supply layer formed above the electron transit layer; and
    a gate electrode formed above the electron supply layer,
    wherein the buffer layer comprises a first region and a second region locally formed whose resistance value is higher than that of the first region, in a horizontal plane and
    the second region is formed up to a part of the electron transit layer formed above the buffer layer, from the buffer layer.

2. The compound semiconductor device according to claim 1, further comprising:
    an electrode formed at upward of the compound semiconductor layered structure, and
    wherein the region is locally formed at a portion position matching with downward of the electrode at least at the buffer layer of the compound semiconductor layered structure.

3. The compound semiconductor device according to (claim 1), wherein a recessed portion is formed at a rear surface of the substrate, and the (second) region is formed at a portion position matching with the recessed portion of the compound semiconductor layered structure.

4. The compound semiconductor device according to claim 3,
    wherein the recessed portion is an opening penetrating the substrate.

5. The compound semiconductor device according to claim 1, wherein the second region is formed by introducing an impurity.

6. The compound semiconductor device according to claim 5,
    wherein the impurity is at least one kind selected from iron, carbon, boron, titanium, and chromium.

7. A manufacturing method of a compound semiconductor device comprising:
    forming a buffer layer, an electron transit layer and an electron supply layer above a substrate sequentially;
    reducing a thickness of a rear surface of the substrate;
    introducing an impurity into the buffer layer and a part of the electron transit layer from a rear surface of the buffer layer to make a resistance value of the buffer layer high, after the thickness reduction process,
    wherein the buffer layer comprises a first region and a second region locally formed whose resistance value is higher than that of the first region, in a horizontal plane and
    the second region is formed up to a part of the electron transit layer formed above the buffer layer, from the buffer layer.

8. The manufacturing method of the compound semiconductor device according to claim 7,
    wherein the impurity is locally introduced into at least the buffer layer to form a region of which resistance value is higher than the other portion of the buffer layer.

9. The manufacturing method of the compound semiconductor device according to claim 8, further comprising:
    forming an electrode at upward of the compound semiconductor layered structure, and
    wherein the region is locally formed at a portion position matching with downward of the electrode.

10. The manufacturing method of the compound semiconductor device according to claim 8, further comprising:
    forming a recessed portion at a rear surface of a substrate on which the compound semiconductor layered structure is formed, and
    wherein the region is formed by introducing the impurity into the compound semiconductor layered structure from the rear surface of the substrate.

11. The manufacturing method of the compound semiconductor device according to claim 10,
    wherein the recessed portion is an opening penetrating the substrate.

12. The manufacturing method of the compound semiconductor device according to claim 7,
    wherein a thickness of the substrate is set to be a value within a range of "0" (zero) μm to 50 μm.

13. The manufacturing method of the compound semiconductor device according to claim 7,
    wherein the impurity is at least one kind selected from iron, carbon, boron, titanium, and chromium.

14. A power supply circuit, comprising:
    a substrate;
    an electron transit layer formed above the substrate;
    a buffer layer formed between the substrate and the electron transit layer;
    an electron supply layer formed above the electron transit layer; and
    a gate electrode formed above the electron supply layer, wherein the buffer layer comprises a first region and a second region locally formed whose resistance value is higher than that of the first region, in a horizontal plane and the second region is formed up to a part of the electron transit layer formed above the buffer layer, from the buffer layer.

15. A high-frequency amplifier amplifying and outputting an input high-frequency voltage, comprising:

a substrate;

an electron transit layer formed above the substrate;

a buffer layer formed between the substrate and the electron transit layer;

an electron supply layer formed above the electron transit layer; and a gate electrode formed above the electron supply layer, wherein the buffer layer comprises a first region and a second region locally formed whose resistance value is higher than that of the first region, in a horizontal plane and the second region is formed up to a part of the electron transit layer formed above the buffer layer, from the buffer layer.

* * * * *